US012628595B2

(12) United States Patent
Yonezawa et al.

(10) Patent No.: US 12,628,595 B2
(45) Date of Patent: May 12, 2026

(54) PLASMA PROCESSING METHOD AND PLASMA PROCESSING APPARATUS

(71) Applicant: Tokyo Electron Limited, Tokyo (JP)

(72) Inventors: Takahiro Yonezawa, Miyagi (JP);
Yusuke Takino, Miyagi (JP); Kenta Ono, Miyagi (JP); Tetsuya Nishizuka, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 277 days.

(21) Appl. No.: 18/199,734

(22) Filed: May 19, 2023

(65) Prior Publication Data

US 2023/0377899 A1 Nov. 23, 2023

(30) Foreign Application Priority Data

May 20, 2022 (JP) ................................. 2022-082706
Apr. 28, 2023 (JP) ................................. 2023-074798

(51) Int. Cl.
*H01L 21/311* (2006.01)
*H01J 37/32* (2006.01)
*H01L 21/3213* (2006.01)

(52) U.S. Cl.
CPC .... *H01L 21/31144* (2013.01); *H01J 37/3211* (2013.01); *H01J 37/32449* (2013.01); *H01L 21/31116* (2013.01); *H01L 21/32136* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 9,899,219 | B2 | 2/2018 | Luong et al. |
| 2014/0332372 | A1* | 11/2014 | Kamada ............ H01L 21/02057 |
| | | | 204/192.34 |
| 2021/0005472 | A1* | 1/2021 | Kanarik ............ H01L 21/67109 |
| 2021/0242032 | A1* | 8/2021 | Colinjivadi ....... H01L 21/31144 |
| 2021/0407817 | A1* | 12/2021 | Marchegiani ....... H01L 21/0234 |

* cited by examiner

*Primary Examiner* — Roberts P Culbert
(74) *Attorney, Agent, or Firm* — PROCOPIO, CORY, HARGREAVES & SAVITCH LLP

(57) ABSTRACT

A plasma processing method according to the present disclosure is performed with a plasma processing apparatus, and includes: (a) preparing a substrate on a substrate support in the chamber, the substrate having an etching target film including a first silicon-containing film, and a first metal-containing film on the etching target film, the first metal-containing film including an opening pattern; and (b) etching the etching target film. (b) includes supplying a processing gas including one or more gases containing carbon, hydrogen, and fluorine into the chamber to form a plasma from the processing gas within the chamber and etch the first silicon-containing film to form the opening pattern in the first silicon-containing film, and a ratio of the number of hydrogen atoms to the number of fluorine atoms in the processing gas is 0.3 or more.

21 Claims, 8 Drawing Sheets

(a)                                                         (b)

PLASMA PROCESSING METHOD AND PLASMA PROCESSING APPARATUS

CROSS-REFERENCE TO RELATED APPLICATION

The present application claims priority under 35 U.S.C. § 119 to Japanese Patent Application No. 2022-082706 filed on May 20, 2022 and Japanese Patent Application No. 2023-074798 filed on Apr. 28, 2023, the entire contents of which are incorporated herein by reference.

BACKGROUND

Field

Exemplary embodiments of the present disclosure relate to plasma processing methods and plasma processing systems.

Description of Related Art

U.S. Pat. No. 9,899,219 discloses a technique of trimming an inorganic resist using a processing gas containing $CH_3F$ or $BCl_3$ to uniformize the dimensions of a pattern formed in the resist.

SUMMARY

One exemplary embodiment of the present disclosure provides a plasma processing method performed with a plasma processing apparatus having a chamber. The plasma processing method includes: (a) preparing a substrate on a substrate support in the chamber, the substrate having an etching target film including a first silicon-containing film, and a first metal-containing film on the etching target film, the first metal-containing film including an opening pattern; and (b) etching the etching target film. (b) includes supplying a processing gas including one or more gases containing carbon, hydrogen, and fluorine into the chamber to form a plasma from the processing gas within the chamber and etch the first silicon-containing film to form the opening pattern in the first silicon-containing film, and a ratio of the number of hydrogen atoms to the number of fluorine atoms in the processing gas is 0.3 or more.

DETAILED DESCRIPTION

Figure 1:
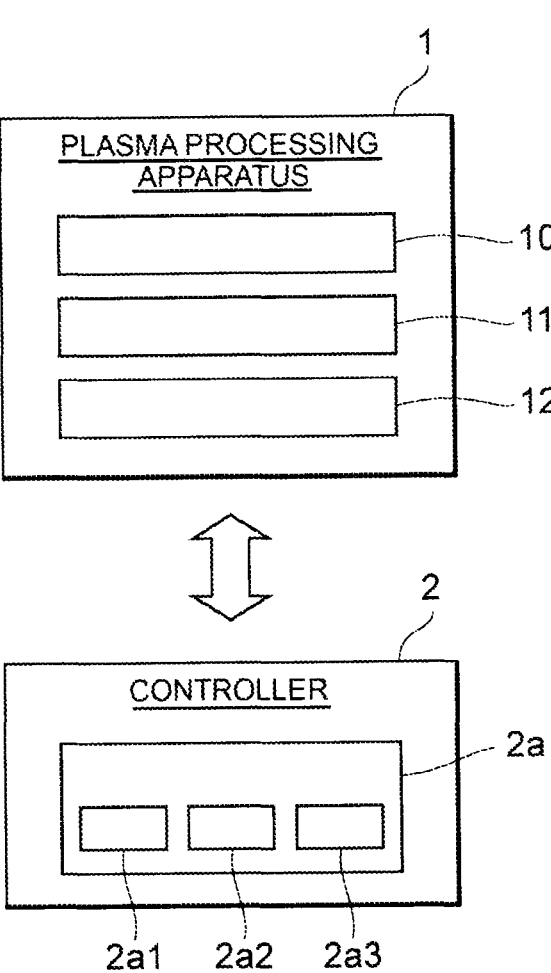
FIG. 1 describes a configuration example of a plasma processing system.

The following describes embodiments of the present disclosure.

One exemplary embodiment provides a plasma processing method performed with a plasma processing apparatus having a chamber. The plasma processing method includes: (a) preparing a substrate on a substrate support in the chamber, the substrate having an etching target film including a first silicon-containing film, and a first metal-containing film on the etching target film, the first metal-containing film including an opening pattern; and (b) etching the etching target film. (b) includes supplying a processing gas including one or more gases containing carbon, hydrogen, and fluorine into the chamber to form a plasma from the processing gas within the chamber and etch the first silicon-containing film to form the opening pattern in the first silicon-containing film, and a ratio of the number of hydrogen atoms to the number of fluorine atoms in the processing gas is 0.3 or more.

In one exemplary embodiment, the first metal-containing film includes a Sn-containing film.

In one exemplary embodiment, the first silicon-containing film includes at least one selected from the group consisting of a film containing silicon and oxygen, a film containing silicon and nitrogen, and a film stack thereof.

In one exemplary embodiment, the etching target film includes an intermediate film on the first silicon-containing film, (b) includes etching the intermediate film using the first metal-containing film as a mask, and forming the opening pattern includes etching the first silicon-containing film using at least one of the first metal-containing film and the intermediate film as a mask.

In one exemplary embodiment, the intermediate film includes at least one selected from the group consisting of a carbon-containing film, a second silicon-containing film different from the first silicon-containing film, and a second metal-containing film different from the first metal-containing film.

In one exemplary embodiment, the intermediate film includes the carbon-containing film and a second silicon-containing film on the carbon-containing film, and the second silicon-containing film includes at least one selected from the group consisting of a film containing silicon and oxygen, a film containing silicon and nitrogen, and a film stack thereof.

In one exemplary embodiment, the processing gas includes hydrogen-containing gas, carbon-containing gas, and fluorine-containing gas.

In one exemplary embodiment, the carbon-containing gas includes a gas that further includes at least one of hydrogen and fluorine.

In one exemplary embodiment, the fluorine-containing gas includes a gas that does not contain carbon.

In one exemplary embodiment, a ratio of the number of hydrogen atoms to the number of carbon atoms in the processing gas is 0.3 or more.

In one exemplary embodiment, the pressure in the chamber in forming the opening pattern is lower than the pressure in the chamber in etching the intermediate film.

In one exemplary embodiment, forming the opening pattern includes controlling the pressure in the chamber to 100 mTorr or less.

In one exemplary embodiment, deposits containing a metal included in the first metal-containing film are generated in etching the intermediate film, and forming the opening pattern includes removing the deposits adhering to the substrate.

In one exemplary embodiment, deposits containing a metal included in the first metal-containing film are generated in etching the intermediate film, and forming the opening pattern includes removing the deposits adhering to an inner wall of the chamber.

In one exemplary embodiment, the plasma processing apparatus includes: a first gas injector disposed on an upper face of the chamber so as to face a substrate support; and a second gas injector disposed on a side face of the chamber, the processing gas includes one or more gases containing carbon and one or more gases without carbon, at least one of the one or more gases containing carbon is supplied from the first gas injector, and at least one of the one or more gases without carbon is supplied from the second gas injector.

In one exemplary embodiment, the plasma processing apparatus includes: a first gas injector disposed in the chamber on an upper face of the chamber; and a second gas injector disposed in the chamber on a side face of the chamber. The processing gas includes at least one carbon-containing gas, the at least one carbon-containing gas is supplied into the chamber from the first gas injector and the second gas injector, and a ratio of a flow rate of the at least one carbon-containing gas supplied into the chamber from the first gas injector to a flow rate of the at least one carbon-containing gas supplied into the chamber from the second gas injector is less than 1.

In one exemplary embodiment, the plasma processing apparatus includes a plasma generator above the substrate support. Forming the opening pattern includes: supplying a source RF signal to the plasma generator to form a plasma from the processing gas; and supplying a bias signal to the substrate support, and the power of the source RF signal has an effective value that is greater than an effective value of the power of the bias signal.

In one exemplary embodiment, the plasma generator includes an electrode facing the substrate support.

In one exemplary embodiment, the plasma generator includes an antenna disposed above the substrate support.

In one exemplary embodiment, the power of the source RF signal has an effective value that is 500 W or more.

In one exemplary embodiment, the bias signal is a RF signal, and the power of the bias signal has an effective value that is 200 W or less.

In one exemplary embodiment, in forming the opening, the first silicon-containing film is etched using the first metal-containing film as a mask.

In one exemplary embodiment, plasma is continuously formed in the chamber from etching the intermediate film to forming the opening.

One exemplary embodiment provides a plasma processing system including: at least one plasma processing apparatus including a chamber, at least one gas supply, a plasma generator, and a substrate support in the chamber; and a controller. The controller is configured to perform: (a) preparing a substrate on the substrate support, the substrate having an etching target film including a first silicon-containing film, and a first metal-containing film on the etching target film, the first metal-containing film including an opening pattern; and (b) etching the etching target film.

(b) includes supplying a processing gas including one or more gases containing carbon, hydrogen, and fluorine into the chamber to form a plasma from the processing gas within the chamber and etch the first silicon-containing film to form the opening pattern in the first silicon-containing film, and controlling so that a ratio of the number of hydrogen atoms to the number of fluorine atoms in the processing gas is 0.3 or more.

The following describes embodiments of the present disclosure in details with reference to the drawings. Like reference numerals designate like elements in the drawings to omit their duplicated descriptions. Unless otherwise specified, positional relationships such as top, bottom, left, and right will be described based on the positional relationships illustrated in the drawings. The accompanying drawings have not necessarily been drawn to scale, and the actual proportions are not limited to the illustrated ones.

<Example of Plasma Processing System>

FIG. 1 illustrates a configuration example of a plasma processing system. In one embodiment, the plasma processing system includes a plasma processing apparatus 1 and a controller 2. The plasma processing system is an example of a substrate processing system, and the plasma processing system 1 is an example of a substrate processing apparatus. The plasma processing apparatus 1 includes a plasma processing chamber 10, a substrate support 11, and a plasma generator 12. The plasma processing chamber 10 has a plasma processing space. The plasma processing chamber 10 has at least one gas supply port for supplying at least one processing gas to the plasma processing space and at least one gas exhaust port for exhausting the gas from the plasma processing space. The gas supply port is connected to a gas supply 20, which will be described later, and the gas exhaust port is connected to an exhaust system 40, which will be described later. The substrate support 11 is disposed in the plasma processing space, and has a substrate support face that supports a substrate.

The plasma generator 12 is configured to form a plasma from the at least one processing gas supplied in the plasma processing space. Plasmas formed in the plasma processing space may include capacitively coupled plasma (CCP), inductively coupled plasma (ICP), electron-cyclotron-resonance (ECR) plasma, helicon wave plasma (HWP), and surface wave plasma (SWP). Various types of plasma generators may also be used, including alternating current (AC) plasma generators and direct current (DC) plasma generators. In one embodiment, the AC signal (AC power) used in the AC plasma generator has a frequency in the range of 100 kHz to 10 GHz. Thus, AC signals include radio frequency (RF) and microwave signals. In one embodiment, the RF signal has a frequency in the range of 100 kHz to 150 MHz. In one embodiment, the plasma processing apparatus 1 may include a plasma generator 12 above the substrate support 11.

<Example of Plasma Processing Apparatus>

Figure 2:
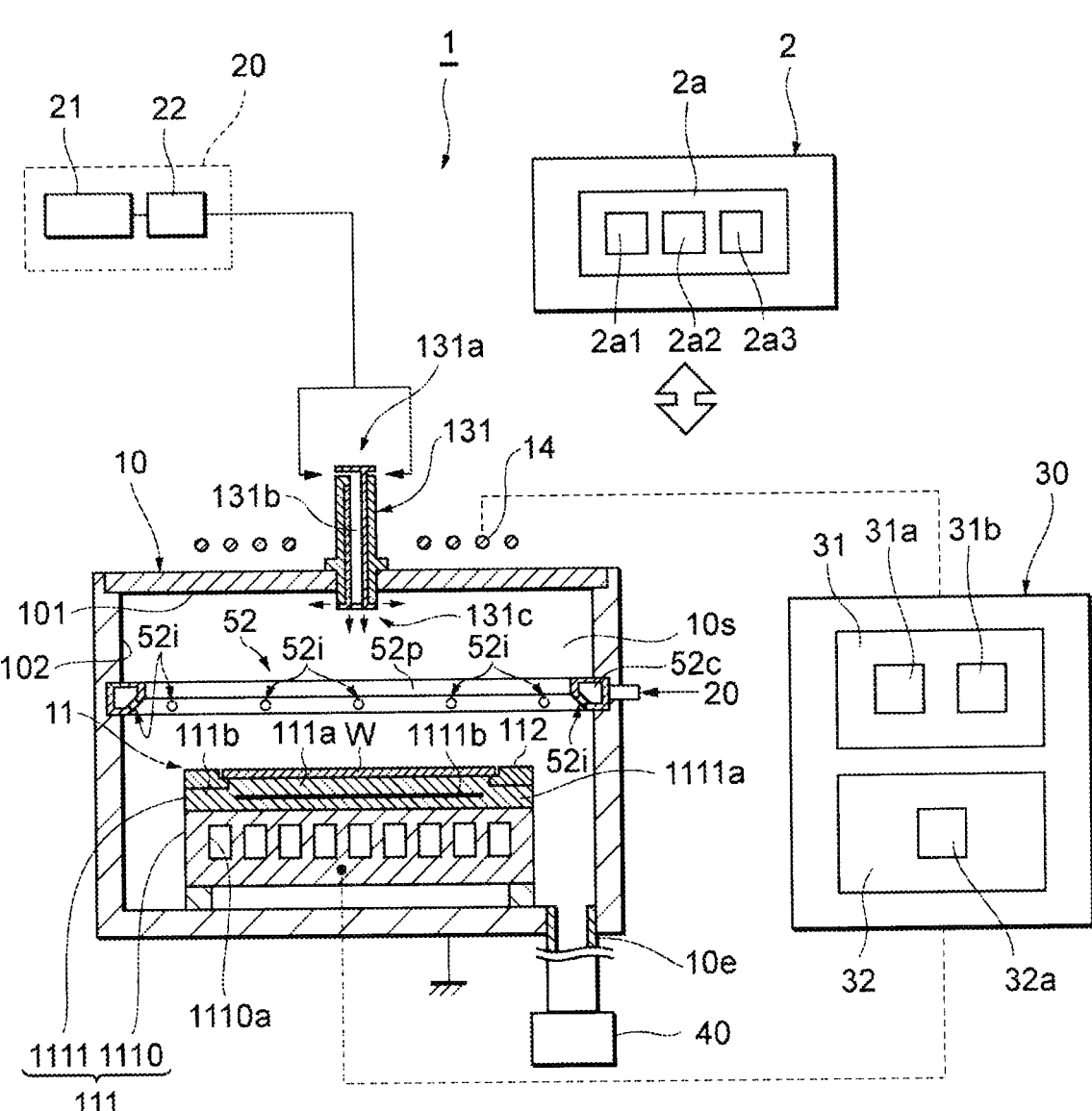
FIG. 2 describes a configuration example of a plasma processing apparatus.

FIG. 2 illustrates a configuration example of a plasma processing system. The plasma processing system includes an inductively coupled plasma processing apparatus 1 and a controller 2. The inductively coupled plasma processing apparatus 1 includes a plasma processing chamber 10, a gas supply 20, a power supply 30, and an exhaust system 40. The plasma processing chamber 10 includes a dielectric window. The plasma processing apparatus 1 also includes a substrate support 11, a gas inlet, and an antenna 14. The substrate support 11 is disposed in the plasma processing chamber 10. The antenna 14 is disposed on or above the plasma processing chamber 10 (i.e., on or above the dielectric window 101).

The plasma processing chamber 10 has a plasma processing space 10s defined by the dielectric window 101, sidewalls 102 of the plasma processing chamber 10 and the substrate support 11. The plasma processing chamber 10 has at least one gas supply port for supplying at least one processing gas to the plasma processing space 10s and at least one gas exhaust port for exhausting gas from the plasma processing space. The plasma processing chamber 10 is grounded.

The substrate support 11 includes a body 111 and a ring assembly 112. The body 111 has a central region 111a for supporting a substrate W and an annular region 111b for supporting the ring assembly 112. A wafer is an example of the substrate W. The annular region 111b of the body 111 surrounds the central region 111a of the body 111 in plan view. The substrate W is disposed on the central region 111a of the body 111, and the ring assembly 112 is disposed on the annular region 111b of the body 111 so as to surround the substrate W on the central region 111a of the body 111. Thus, the central region 111a is also referred to as a substrate support face for supporting the substrate W, and the annular region 111b is also referred to as a ring support face for supporting the ring assembly 112.

In one embodiment, the body 111 includes a base 1110 and an electrostatic chuck 1111. The base 1110 includes an electrically conductive member. The electrically conductive member of the base 1110 can function as a bias electrode. The electrostatic chuck 1111 is disposed on the base 1110. The electrostatic chuck 1111 includes a ceramic member 1111a and an electrostatic electrode 1111b disposed in the ceramic member 1111a. The ceramic member 1111a has the central region 111a. In one embodiment, the ceramic member 1111a also has the annular region 111b. Note that another member surrounding the electrostatic chuck 1111, such as an annular electrostatic chuck or an annular insulating member, may have the annular region 111b. In this case, the ring assembly 112 may be disposed on the annular electrostatic chuck or the annular insulating member, or may be disposed on both the electrostatic chuck 1111 and the annular insulating member. At least one RF/DC electrode, which is coupled to a radio frequency (RF) power source 31 and/or a direct current (DC) power source 32 described below, may be disposed in the ceramic member 1111a. In this case, the at least one RF/DC electrode functions as a bias electrode. Note that the conductive member of the base 1110 and the at least one RF/DC electrode may function as a plurality of bias electrodes. Also, the electrostatic electrode 1111b may function as a bias electrode. Thus, the substrate support 11 includes at least one bias electrode.

The ring assembly 112 includes one or more annular members. In one embodiment, the one or more annular members include one or more edge rings and at least one cover ring. The edge ring(s) is formed from a conductive material or an insulating material, and the cover ring(s) is formed from an insulating material.

The substrate support 11 may include a temperature-controlled module configured to control at least one of the electrostatic chuck 1111, the ring assembly 112, and the substrate to a target temperature. The temperature-controlled module may include a heater, a heat transfer medium, a channel 1110a, or a combination of them. A heat transfer fluid, such as brine or gas, flows through the channel 1110a. In one embodiment, the channel 1110a is formed in the base 1110 and one or more heaters are disposed in the ceramic member 1111a of the electrostatic chuck 1111. The substrate support 11 may include a heat-transfer gas supply configured to supply a heat transfer gas to the gap between the rear face of the substrate W and the central region 111a.

The gas inlet is configured to introduce at least one processing gas from the gas supply 20 into the plasma processing space 10s. In one embodiment, the gas inlet includes a center gas injector (CGI) 13. The CGI 131 is disposed above the substrate support 11 and attached to a central opening formed in the dielectric window 101. The CGI 131 has at least one gas supply port 131a, at least one gas channel 131b, and at least one gas inlet port 131c. The processing gas supplied to the gas supply port 131a passes through the gas channel 131b and is introduced into the plasma processing space 10s from the gas inlet port 131c. In addition to or instead of the CGI 131, the gas inlet may include one or more side gas injectors (SGIs) attached to one or more openings formed in the side walls 102.

The gas inlet may include a peripheral gas injector 52 that is an example of the SGI. The peripheral gas injector 52 includes a plurality of peripheral injection ports 52i. These peripheral injection ports 52i supply gas mainly toward the edge of the substrate W. These peripheral injection ports 52i are open toward the edge of the substrate W or the edge of the central region 111a to support the substrate W. These peripheral injection ports 52i are placed along the circumferential direction of the substrate support 11, below the gas inlet port 131c and above the substrate support 11. That is, the plurality of peripheral injection ports 52i are placed annularly to be centered on the axis of the gas channel 131b in a region with a lower electron temperature (plasma diffusion region) than in immediately below the dielectric window 101. Note that the CGI is an example of a first gas injector. The SGI is an example of a second gas injector.

The gas supply 20 may include at least one gas source 21 and at least one flow rate controller 22. In one embodiment, the gas supply 20 is configured to supply at least one processing gas from a corresponding gas source 21 to the gas inlet via a corresponding flow rate controller 22. For instance, each flow rate controller 22 may include a mass flow controller or a pressure-controlled flow rate controller. The gas supply 20 also may include one or more flow rate modulation devices that modulate or pulse the flow rate of the at least one processing gas.

The power supply 30 includes a RF power supply 31 that is coupled to the plasma processing chamber 10 via at least one impedance matching circuit. The RF power supply 31 is configured to supply at least one RF signal (RF power) to the at least one bias electrode and the antenna 14. This forms a plasma from the at least one processing gas supplied to the plasma processing space 10s. Thus, the RF power supply 31 may function as at least part of a plasma generator that is configured to form a plasma from one or more processing gases in the plasma processing chamber 10. A bias RF signal, which is supplied to the at least one bias electrode, generates a bias potential in the substrate W, so that ions in the formed plasma can be drawn toward the substrate W.

In one embodiment, the RF power supply 31 includes a first RF generator 31a and a second RF generator 31b. The first RF generator 31a is coupled to the antenna 14 and configured to generate a source RF signal (source RF power) for plasma generation via at least one impedance matching circuit. In one embodiment, the source RF signal has a frequency in the range of 10 MHz to 150 MHz. In one embodiment, the first RF generator 31a may be configured to generate a plurality of source RF signals each having a different frequency. The generated one or more source RF signals are supplied to the antenna 14.

The second RF generator 31b is coupled to the at least one bias electrode via at least one impedance matching circuit and is configured to generate a bias RF signal (bias RF power). The frequency of the bias RF signal may be the same as or different from the frequency of the source RF signal. In one embodiment, the bias RF signal has a frequency lower than the frequency of the source RF signal. In one embodiment, the bias RF signal has a frequency within the range of 100 kHz to 60 MHz. In one embodiment, the second RF generator 31*b* may be configured to generate a plurality of bias RF signals each having a different frequency. The generated one or more bias RF signals are supplied to the at least one bias electrode. In various embodiments, at least one of the source RF signal and bias RF signal may be pulsed.

The power supply 30 may also include a DC power supply 32 that is coupled to the plasma processing chamber 10. The DC power supply 32 includes a bias DC generator 32*a*. In one embodiment, the bias DC generator 32*a* is connected to the at least one bias electrode and configured to generate a bias DC signal. The generated bias DC signal is applied to the at least one bias electrode.

In various embodiments, the bias DC signal may be pulsed. In this case, a sequence of voltage pulses is applied to the at least one bias electrode. The voltage pulses may have rectangular, trapezoidal, triangular waveforms or waveforms in a combination of them. In one embodiment, a waveform generator to generate a sequence of voltage pulses from DC signal is connected between the bias DC generator 32*a* and the at least one bias electrode. Thus, the bias DC generator 32*a* and the waveform generator constitute a voltage pulse generator. The voltage pulses may have a positive polarity or a negative polarity. The sequence of voltage pulses may include one or more positive voltage pulses or one or more negative voltage pulses in one cycle. The bias DC generator 32*a* may be provided in addition to the RF power supply 31, or may be provided instead of the second RF generator 31*b*.

The antenna 14 includes one or more coils. In one embodiment, the antenna 14 may include an outer coil and an inner coil that are coaxially disposed. In this case, the RF power supply 31 may be connected to both the outer coil and the inner coil, or may be connected to either one of the outer coil and the inner coil. In the former case, the same RF generator may be connected to both the outer and inner coils, or separate RF generators may be connected to the outer and inner coils separately.

For instance, the exhaust system 40 may be connected to a gas exhaust port 10*e* provided at the bottom of the plasma processing chamber 10. The exhaust system 40 may include a pressure regulation valve and a vacuum pump. The pressure regulation valve regulates the pressure in the plasma processing space 10*s*. The vacuum pump may include a turbomolecular pump, a dry pump, or a combination of these.

Figure 3:
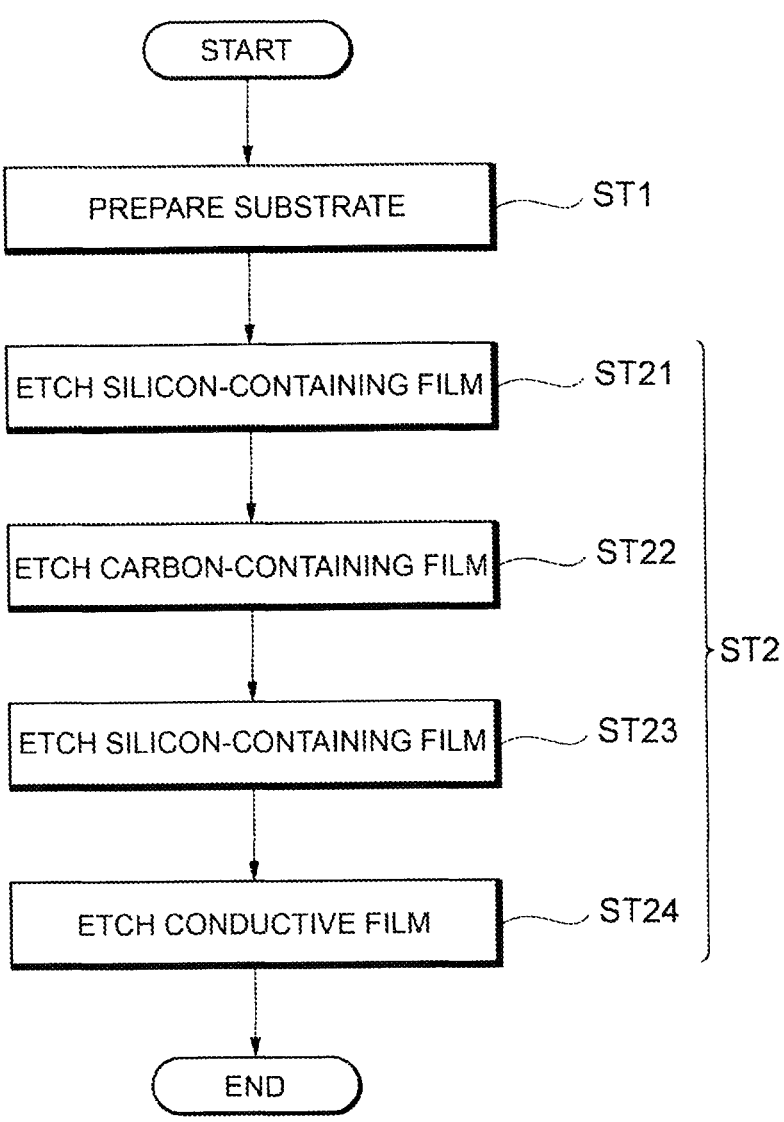
FIG. 3 is a flowchart illustrating an example of the present processing method.

FIG. 3 is a flowchart illustrating one example of a plasma processing method (hereinafter also referred to as "this processing method") according to one exemplary embodiment. FIGS. 4A to 4E illustrate examples of the cross-sectional structure of a substrate W. This processing method is performed to the substrate W with the plasma processing apparatus 1 illustrated in FIG. 2, for example. Referring to the drawings, the following describes an example of performing this processing method illustrated in FIG. 3 to the substrate W illustrated in FIG. 4A. In the following example, the controller 2 illustrated in FIGS. 1 and 2 controls each part of the plasma processing apparatus 1 illustrated in FIG. 2 to execute this processing method.

(Step ST1: Substrate Preparation)

In step ST1, a substrate W is prepared in the plasma processing space 10*s* of the plasma processing chamber 10. In step ST1, the substrate W is disposed at least on the substrate support 11 and held by the electrostatic chuck 1111. At least part of forming each component of the substrate W may be performed as part of step ST1 within the plasma processing space 10*s*. After all or part of the components of the substrate W is formed in a device or chamber outside the plasma processing apparatus 1, the substrate W may be conveyed into the plasma processing space 10*s* and disposed on the substrate support 11.

Step ST1 may include a step of setting the temperature of the substrate support 11. To set the temperature of the substrate support 11, the controller 2 can control a temperature-controlled module. In one example, the controller 2 may set the temperature of the substrate support 11 to 60° C. or lower.

The substrate W has a film to be etched (hereinafter called an etching target film) including a first silicon-containing film and a first metal-containing film on the etching target film. The etching target film may include only the first silicon-containing film, or may have an intermediate film on the first silicon-containing film. The intermediate film can be formed from a material having an etching rate higher than that of the first metal-containing film in step ST2. The intermediate film can be formed from a material having an etching rate lower than that of the first silicon-containing film in step ST2. For instance, the intermediate film may include at least one selected from the group consisting of a carbon-containing film, a second silicon-containing film different from the first silicon-containing film, and a second metal-containing film different from the first metal-containing film, or may be a film stack including two or more of these.

Figure 4A:
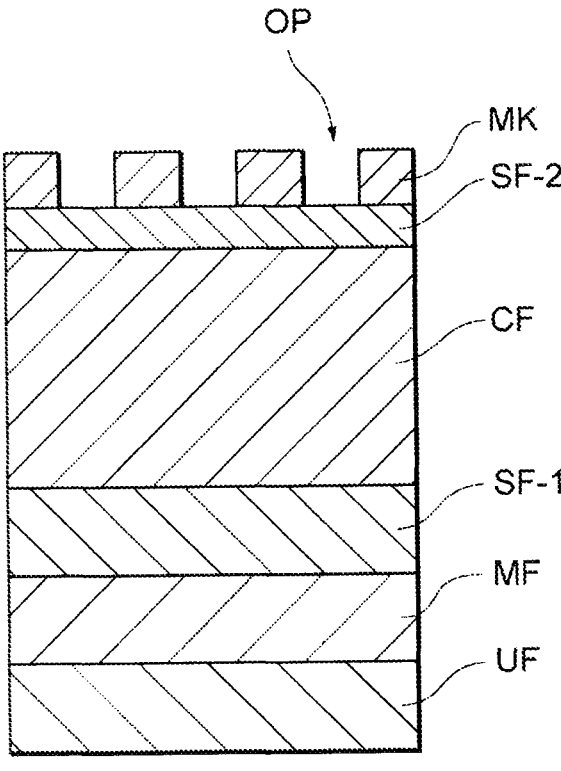
FIG. 4A illustrates an example of the cross-sectional structure of a substrate W.

In one example, the substrate W prepared in the plasma processing chamber 10 has the cross-sectional structure illustrated in FIG. 4A. It includes an underlying film UF, a metal compound film MF, a silicon-containing film SF-1, a carbon-containing film CF, a silicon-containing film SF-2, and a mask film MK. The silicon-containing film SF-1 is an example of the first silicon-containing film. The carbon-containing film CF and the silicon-containing film SF-2 are examples of the intermediate film. The silicon-containing film SF-2 is an example of the second silicon-containing film. The mask film MK is an example of the first metal-containing film. The silicon-containing films SF-1 and SF-2 are also collectively referred to as a "silicon-containing film SF". The first silicon-containing film can be a film in which the opening pattern of the first metal-containing film (mask film MK in one example) is formed by etching. The second silicon-containing film (in one example, silicon-containing film SF-2) can be a film to be etched using the first metal-containing film as a mask. The first silicon-containing film (silicon-containing film SF-1 in one example) may be a film to be etched using the film (carbon-containing film CF in one example) as a mask, the used film being etched using the first metal-containing film (mask film MK in one example) as a mask.

Examples of the underlying film UF include an organic film, dielectric film, metal film, or semiconductor film formed on a silicon wafer. The underlying film UF also may be a silicon wafer. The underlying film UF may include a stack of films.

The silicon-containing films SF-1 and SF-2 can be a film containing silicon (Si). The silicon-containing film SF can include a film containing silicon and oxygen, such as a silicon oxide film, or a film containing silicon and nitrogen, such as a silicon nitride film. In one example, the silicon-containing film SF-1 is a $SiO_2$ film and the silicon-containing film SF-2 is a SiON film. The silicon-containing film SF may be a film having other film types as long as it is a film containing silicon. The silicon-containing film SF may include a silicon film (e.g., a polycrystal silicon film). The silicon-containing film SF may include at least one of a silicon nitride film, a polycrystal silicon film, a carbon-containing silicon film, and a low dielectric constant film. The carbon-containing silicon film can include a SiC film and/or a SiOC film. The low dielectric constant film contains silicon and can be used as an interlayer insulating film. The silicon-containing film SF may be a spin-on-glass (SOG) film, a silicon-containing anti-reflection (SiARC) film. The silicon-containing film SF may be a film doped with an impurity such as phosphorus, boron, or nitrogen.

The silicon-containing film SF may include two or more silicon-containing films, each having a different film type. These two or more silicon-containing films may include a silicon oxide film and a silicon nitride film. For instance, the silicon-containing film SF may be a multilayer film including one or more silicon oxide films and one or more silicon nitride films that are alternately stacked. The silicon-containing film SF may be a multilayer film including a plurality of silicon oxide films and a plurality of silicon nitride films that are alternately stacked. Alternatively, the two or more silicon-containing films may include a silicon oxide film and a silicon film. For instance, the silicon-containing film SF may be a multilayer film including one or more silicon oxide films and one or more silicon films that are alternately stacked. The silicon-containing film SF may be a multilayer film including a plurality of silicon oxide films and a plurality of polycrystal silicon films that are alternately stacked. Alternatively, the two or more silicon-containing films may include a silicon oxide film, a silicon nitride film, and a silicon film.

The silicon-containing film SF-1 may be a film having higher etching resistance than that of the silicon-containing film SF-2. For instance, the etching resistance may be resistance in etching with the processing gas that is fluorocarbon gas and/or hydrofluorocarbon gas. In one example, the silicon-containing film SF-1 may be a $SiO_2$ film and the silicon-containing film SF-2 may be a SOG film. The silicon-containing film SF-2 may be thinner than the silicon-containing film SF-1. The silicon-containing film SF-2 may be thinner than the mask film MK and/or the carbon-containing film CF.

The carbon-containing film CF can be a film containing carbon. The carbon-containing film CF may be a film containing an organic material, or may be a film containing an inorganic material. In one example, the carbon-containing film CF is a spin-on carbon (SOC film) or amorphous carbon (ACL) film.

The mask film MK can be a first metal-containing film. The first metal-containing film may be a tin-containing film. The mask film MK is formed from a material having an etching rate lower than that of the silicon-containing film SF-2 in step ST2. The mask film MK may be a photoresist film for EUV. In one example, the photoresist film for EUV can be a tin-containing film. In one example, the tin-containing film can include tin oxide and/or tin hydroxide. In one example, the photoresist film for EUV can be a film containing at least one material selected from the group consisting of titanium (Ti), chromium (Cr), cobalt (Co), nickel (Ni), copper (Cu), zinc (Zn), germanium (Ge), arsenic (As), silver (Ag), indium (In), antimony (Sb), tellurium (Te), iodine (I), and hafnium (Hf).

When the intermediate film includes a second metal-containing film, the second metal-containing film in one example can be a metal-containing film containing at least one metal selected from the group consisting of aluminum (Al), titanium (Ti), copper (Cu), zinc (Zn), gallium (Ga), zirconium (Zr), molybdenum (Mo), ruthenium (Ru), indium (In), tin (Sn), hafnium (Hf), tantalum (Ta), and tungsten (W). The second metal-containing film may include at least one material selected from the group consisting of germanium (Ge), arsenic (As), antimony (Sb), tellurium (Te) and iodine (I).

The mask film MK has an opening pattern that defines at least one opening OP on the silicon-containing film SF. The mask film MK has at least one side wall except for the periphery of the mask film MK. The opening(s) OP is a closed space defined by the side wall. The at least one opening OP defined by the mask film MK may have any shape in the plan view of the substrate W. This shape may include circular, elliptical, rectangular, and linear. The opening pattern of the mask film MK can include an array pattern in which a plurality of hole-shaped openings OP are regularly disposed in the plan view of the substrate W. The hole shape can include circular, elliptical, or rectangular. The opening pattern that the mask film MK has can include a line-and-space (L/S) pattern in which a plurality of openings OP each having a linear shape are arranged at regular intervals in the plan view of the substrate W. The pitch of the openings OP (the distance between the centers of the mask films MK) may be 100 nm or less. Alternatively, the width of the openings OP may be less than 30 nm. When the openings OP have the shape of a hole, the width may be the diameter of the hole. When the opening pattern has a line-and-space pattern, the width may be the width of the line or the space. The thickness of the silicon-containing film SF-1 or SF-2 may be 40 nm or less or 20 nm or less.

The surface (upper face) of the silicon-containing film SF-2 is exposed in the openings OP defined by the mask film MK. In step ST2 described below, the silicon-containing film SF-2, carbon-containing film CF, silicon-containing film SF-1, and metal compound film MF are etched based on the shape of the openings OP defined by the mask film MK. Then, recesses RC such as holes and trenches are formed in each film. Each of the one or more recesses RC formed in each film has a shape based on each of the one or more openings OP in the plan view of the substrate W.

The opening pattern that the mask film MK has can have defects. In one example, the defects of the opening pattern may include etching residue generated when the opening pattern is formed in the mask film MK. Etching residue may exist on the side wall of the mask film MK that defines the openings OP and on the bottom of the openings OP (that is, the surface of the silicon-containing film SF-2).

(Step ST2: Etching)

In step ST2, the films disposed below the mask film MK on the substrate W are etched. Step ST2 includes a sub-step of etching the silicon-containing film SF-2 (step ST21), a sub-step of etching the carbon-containing film CF (step ST22), a sub-step of etching the silicon-containing film SF-1 (step ST23), and a sub-step of etching the metal compound film MF (step ST24).

Each of the sub-steps in step ST2 can include a step of supplying a processing gas in the plasma processing chamber 10, a step of supplying a source RF signal, and a step of supplying a bias RF signal. In each of these steps, the active species (ions, radicals) of the plasma are formed from the processing gas, and the films are etched by these active species. These processing gas, source RF signal, and bias signal may start to be supplied in any order. Plasma may be continuously formed in the plasma processing chamber 10 over two or more consecutive sub-steps in step ST2. In other words, plasma may be formed without interruption between two or more consecutive sub-steps. This reduces particles generated in the plasma processing chamber 10. Each of the sub-steps in step ST2 may be performed in two or more plasma processing chambers. For instance, step ST21 may be performed in a first chamber, step ST22 in a second chamber, step ST23 in a third chamber, and step ST24 in a fourth chamber. Step ST21 and step ST23 of etching the silicon-containing film SF may be performed in the same chamber. That is, the first chamber and the third chamber may be the same chamber.

In each of the sub-steps in step ST2, the processing gas is supplied into the plasma processing chamber 10. The type of processing gas may be appropriately selected based on the material of the film to be etched in each step, the thickness of the film, the material of the film above and/or below the film, the pattern that the film as a mask has, and other factors.

In each sub-step of step ST2, the pressure in the plasma processing chamber 10 may be appropriately set. In one example, the pressure in the plasma processing chamber 10 in step ST23 may be set lower than the pressure in the plasma processing chamber 10 in steps ST21 and ST22, which are steps for etching the intermediate film. In one example, the pressure in the plasma processing chamber 10 can be set at 100 mTorr or less, 50 mTorr or less, 30 mTorr or less, or 10 mTorr or less.

(Step ST21: Etching Silicon-Containing Film SF-2)

Figure 4B:
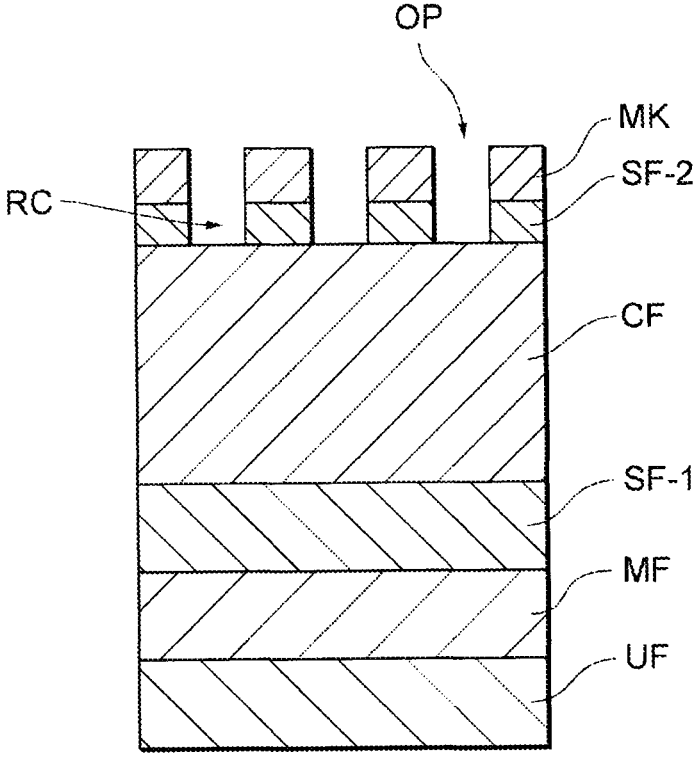
FIG. 4B illustrates an example of the cross-sectional structure of a substrate W.

Next, as illustrated in FIG. 4B, the silicon-containing film SF-2 is etched in step ST21. In one example, the silicon-containing film SF-2 may be etched using a plasma formed from a processing gas containing fluorocarbon and/or hydrofluorocarbon gases. In step ST21, the substrate W is etched using a plasma formed from this processing gas, so that the silicon-containing film SF-2 is etched using the mask film MK as a mask, thus forming recesses RC in the silicon-containing film SF-2. Also, the carbon-containing film CF is exposed at the bottom of each recess RC. During etching of the silicon-containing film SF-2, a portion of the mask film MK may be etched. If the opening pattern of the mask film MK has defects including etching residue, the silicon-containing film SF-2 can be etched using this etching residue as a mask. That is, the pattern formed in the silicon-containing film SF-2 by the recesses RC can also have defects due to the etching residue.

(Step ST22: Etching Carbon-Containing Film CF)

Figure 4C:
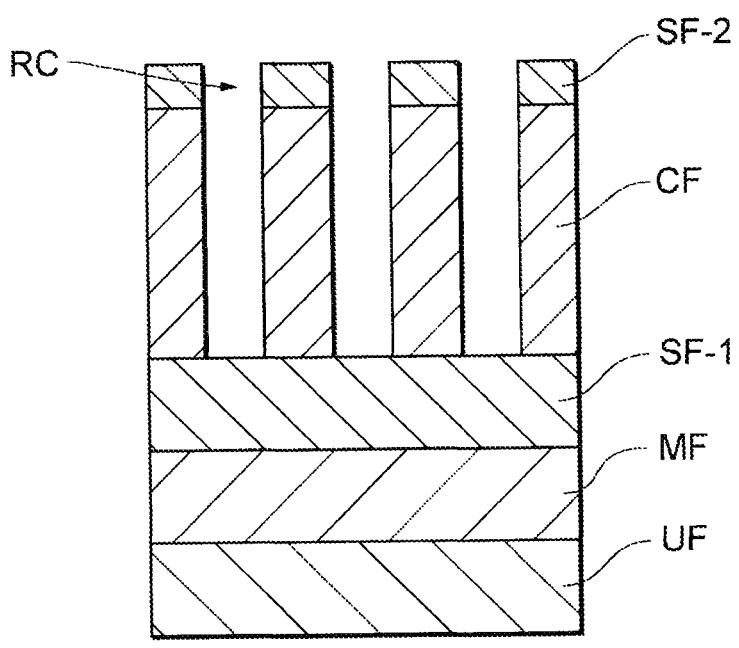
FIG. 4C illustrates an example of the cross-sectional structure of a substrate W.

Next, as illustrated in FIG. 4C, the carbon-containing film CF is etched in step ST22. In one example, the carbon-containing film CF may be etched using a plasma formed from a processing gas containing hydrogen, halogens and oxygen. In one example, the processing gas may include one or more gases including molecules containing hydrogen, bromine, chlorine and/or iodine. In one example, the gases include $H_2$, $Br_2$, $Cl_{12}$, HBr, HCl, and HI. The processing gas may include one or more gases including oxygen-containing molecules. In one example, the gases include $O_2$, $CO_2$, and COS. The processing gas may also include inert gases such as He, Ar, and $N_2$.

In one example, when the mask film MK is a tin-containing film, etching the substrate W using a plasma formed from the processing gas in step ST22 removes the mask film MK, as illustrated in FIG. 4C. Then, the carbon-containing film CF is etched using the silicon-containing film SF-2 as a mask, so that recesses RC are formed in the carbon-containing film CF. The silicon-containing film SF-1 is exposed at the bottom of each recess RC. During etching of the carbon-containing film CF, a portion of the silicon-containing film SF-2 may be etched. If the opening pattern of the mask film MK has defects including etching residue, the carbon-containing film CF can be etched using the silicon-containing film SF-2 having defects due to this etching residue as a mask. That is, the pattern formed in the carbon-containing film CF by the recesses RC can also have defects due to the etching residue.

(Step ST22: Etching Silicon-Containing Film SF-1)

Figure 4D:
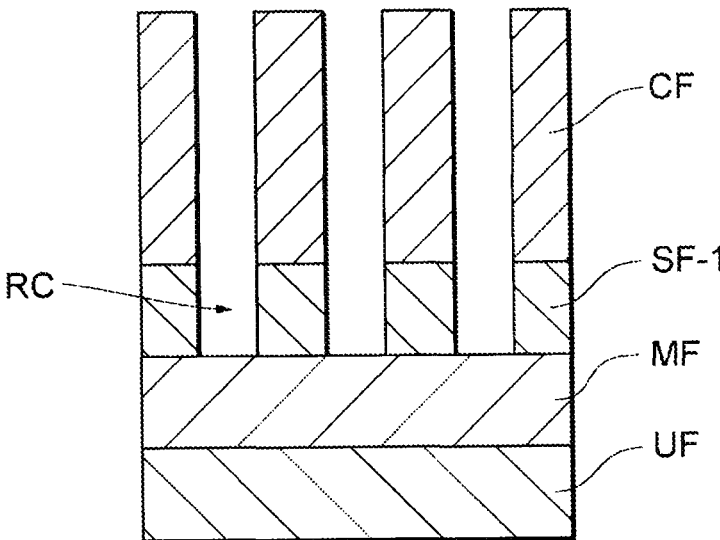
FIG. 4D illustrates an example of the cross-sectional structure of a substrate W.

Next, as illustrated in FIG. 4D, the silicon-containing film SF-1 is etched in step ST23. In one example, the silicon-containing film SF-1 may be etched using a plasma formed from a processing gas including one or more gases containing carbon, hydrogen, and fluorine. The processing gas includes one or more gases. Each of the one or more gases may contain hydrogen, carbon and fluorine. When the one or more gases are a plurality of gases, one of the plurality of gases contains one or more of hydrogen, carbon and fluorine, and some or all of the remaining one or more gases of the plurality of gases may contain the remainder of hydrogen, carbon and fluorine.

The processing gas used in step ST23 can include a gas capable of generating hydrogen fluoride (HF) species in the plasma processing chamber 10 during plasma processing. The hydrogen fluoride species acts as an etchant to etch the silicon-containing film SF-1 in step ST23.

The gas containing carbon, hydrogen and fluorine may be at least one gas selected from the group consisting of hydrofluorocarbons. For instance, hydrofluorocarbons are at least one of $CH_2F_2$, $CHF_3$, and $CH_3F$. Hydrofluorocarbons may contain two or more carbon atoms and may contain two or more and six or less carbon atoms. For instance, hydrofluorocarbons may contain two carbon atoms, as in $C_2HF_5$, $C_2H_2F_4$, $C_2H_3F_3$, and $C_2H_4F_2$. For instance, hydrofluorocarbons may contain three or four carbon atoms, as in $C_3HF_7$, $C_3H_2F_2$, $C_3H_2F_4$, $C_3H_2F_6$, $C_3H_3F_5$, $C_4H_2F_6$, $C_4H_5F_5$, and $C_4H_2F_8$. For instance, hydrofluorocarbons may contain five carbon atoms, as in $C_5H_2F_6$, $C_5H_2F_{10}$, and $C_5H_3F_7$. In one embodiment, the hydrofluorocarbon gas includes at least one selected from the group consisting of $C_3H_2F_4$, $C_3H_2F_6$, $C_4H_2F_6$ and $C_4H_2F_8$. The processing gas may include hydrogen fluoride (HF) that is a gas capable of generating hydrogen fluoride (HF) species in the plasma processing chamber 10 during plasma processing. In the processing gas, the ratio of the number of hydrogen atoms to the number of fluorine atoms may be 0.3 or more, 0.4 or more, or 0.5 or more. In the processing gas, the ratio of the number of hydrogen atoms to the number of carbon atoms may be 1.0 or more, 1.5 or more, or 2.0 or more.

The processing gas may include a gas containing hydrogen and fluorine that is a mixture of gases capable of generating hydrogen fluoride species in the plasma processing chamber 10 during plasma processing. The mixture of gases capable of generating hydrogen fluoride species may include a hydrogen source and a fluorine source. For instance, the hydrogen source may be $H_2$, $NH_3$, $H_2O$, $H_2O_2$ or hydrocarbons ($CH_4$, $C_3H_6$, etc.). The fluorine source may be $BF_3$, $NF_3$, $PF_3$, $PF_5$, $SF_6$, $WF_6$, $XeF_2$ or fluorocarbons. In one example, the mixture of gases capable of generating hydrogen fluoride species is a mixture of gases that are nitrogen trifluoride ($NF_3$) and hydrogen ($H_2$).

The processing gas may also include a carbon-containing gas that is at least one carbon-containing gas selected from the group consisting of hydrocarbon ($C_xH_y$) and fluorocarbon ($C_xF_w$), where x, y, v and w are natural numbers. For instance, hydrocarbons may include $CH_4$, $C_2H_6$, $C_3H_6$, $C_3H_8$ and $C_4H_{10}$. For instance, fluorocarbons may include $CF_4$, $C_2F_2$, $C_2F_4$, $C_3F_8$, $C_4F_6$, $C_4F_8$ and $C_5F_8$. Chemical species generated from these carbon-containing gases can protect the mask film MK.

The processing gas also may include at least one phosphorus-containing molecule. The phosphorus-containing molecule may be an oxide such as tetraphosphorus decaoxide ($P_4O_{10}$), tetraphosphorus octaoxide ($P_4O_8$), tetraphosphorus hexaoxide ($P_4O_6$), and others. Tetraphosphorus decaoxide may be referred to as diphosphorus pentoxide ($P_2O_5$). Phosphorus-containing molecules may be halides (phosphorus halides) such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), and phosphorus iodide ($PI_3$). That is, the molecules containing phosphorus may be a fluoride containing fluorine as a halogen element (phosphorus fluoride). Alternatively, the molecules containing phosphorus may contain a halogen element other than fluorine. The phosphorus-containing molecules may be a phosphoryl halide such as phosphoryl fluoride ($POF_3$), phosphoryl chloride ($POCl_3$), or phosphoryl bromide ($POBr_3$). The phosphorus-containing molecules may be phosphine ($PH_3$), calcium phosphide (such as $Ca_3P_2$), phosphoric acid ($H_3PO_4$), sodium phosphate ($Na_3PO_4$), hexafluorophosphate ($HPF_6$), and others. The phosphorus-containing molecules may be fluorophosphines ($H_xPF_y$), where the sum of x and y is 3 or 5. Examples of fluorophosphines include $HPF_2$ and $H_2PF_3$. The processing gas also may include the at least one phosphorus-containing molecule that is one or more phosphorus-containing molecules of the above-mentioned phosphorus-containing molecules. For instance, the processing gas can include the at least one phosphorus-containing molecule that is at least one of $PF_3$, $PCl_3$, $PF_5$, $PCl_5$, $POCl_3$, $PH_3$, $PBr_3$, and $PBr_6$. When each phosphorus-containing molecule contained in the processing gas is liquid or solid, each phosphorus-containing molecule can be vaporized by heating or the like and supplied into the plasma processing chamber 10.

The processing gas may also include halogen-containing molecules. The halogen-containing molecules may or may not contain carbon. The halogen-containing molecules may be fluorine-containing molecules, halogen-containing molecules containing a halogen element other than fluorine, or halogen-containing molecules containing fluorine and a halogen element other than fluorine. For instance, the fluorine-containing molecules may include gases such as nitrogen trifluoride ($NF_3$), sulfur hexafluoride ($SF_6$), and boron trifluoride ($BF_3$). For instance, the halogen-containing molecules containing a halogen element other than fluorine may be at least one selected from the group consisting of chlorine-containing gas, bromine-containing gas and iodine. For instance, the chlorine-containing gas includes chlorine ($Cl_2$), hydrogen chloride (HCl), silicon dichloride ($SiCl_2$), silicon tetrachloride ($SiCl_4$), carbon tetrachloride ($CCl_4$), dicyclosilane ($SiH_2Cl_2$), disilicon hexachloride ($Si_2Cl_6$), chloroform ($CHCl_3$), dichloromethane ($CH_2Cl_2$), sulfuryl chloride ($SO_2Cl_2$), and boron trichloride ($BCl_3$). For instance, the bromine-containing gas includes gases such as bromine ($Br_2$), hydrogen bromide (HBr), dibromodifluoromethane ($CBr_2F_2$), bromopentafluoroethane ($C_2F_5Br$), phosphorus tribromide ($PBr_3$), phosphorus pentabromide ($PBr_5$), phosphate oxybromide ($POBr_3$), and boron tribromide ($BBr_3$). For instance, the iodine-containing gas includes gases such as hydrogen iodide (HI), trifluoroiodomethane ($CF_3I$), pentafluoroiodoethane ($C_2F_5I$), heptafluoropropyliodide ($C_3F_7I$), iodine pentafluoride ($IF_5$), iodine heptafluoride ($IF_7$), iodine ($I_2$), and phosphorus triiodide ($PI_3$). The chemical species generated from these halogen-containing molecules can be used to control the shape of the recesses formed by plasma etching.

The processing gas may also include oxygen-containing molecules. For instance, the oxygen-containing molecules may include $O_2$, $CO_2$ or CO. The processing gas may also include noble gases such as Ar, Kr, and Xe.

In the plasma processing apparatus 1 of FIG. 2, the processing gas may be supplied into the plasma processing chamber 10 from one or both of the center gas injector 131 and the side gas injector. In one example, the flow rate of the carbon-containing gas supplied from the side gas injector may be greater than the flow rate of the carbon-containing gas supplied from the center gas injector 131. Specifically, the ratio of the flow rate of the carbon-containing gas supplied from the center gas injector 131 to the flow rate of the carbon-containing gas contained in the processing gas may be 50% or less, and the ratio of the flow rate of the carbon-containing gas supplied from the side gas injector to the flow rate of the carbon-containing gas contained in the processing gas may be 50% or more. The ratio of the flow rate of the carbon-containing gas supplied from the center gas injector 131 to the flow rate of the carbon-containing gas contained in the processing gas may be 20% or less, and the ratio of the flow rate of the carbon-containing gas supplied from the side gas injector to the flow rate of the carbon-containing gas contained in the processing gas may be 80% or more. The ratio of the flow rate of the carbon-containing gas supplied from the center gas injector 131 to the flow rate of the carbon-containing gas contained in the processing gas may be 10% or less, and the ratio of the flow rate of the carbon-containing gas supplied from the side gas injector to the flow rate of the carbon-containing gas contained in the processing gas may be 90% or more. The ratio of the flow rate of the carbon-containing gas supplied from the center gas injector 131 to the flow rate of the carbon-containing gas contained in the processing gas may be 5% or less, and the ratio of the flow rate of the carbon-containing gas supplied from the side gas injector to the flow rate of the carbon-containing gas contained in the processing gas may be 95% or more. The ratio of the flow rate of the carbon-containing gas supplied from the side gas injector to the flow rate of the carbon-containing gas contained in the processing gas may be 100%.

In one example, of the processing gases supplied into the plasma processing chamber 10, the number of carbon atoms contained in the carbon-containing gas supplied from the center gas injector 131 may be larger than the number of carbon atoms contained in the carbon-containing gas supplied from the side gas injector.

In this way, at least part of the carbon-containing gas contained in the processing gas may be supplied into the plasma processing chamber 10 from the side gas injector. This improves the uniformity of the etching rate of the etching film and/or the uniformity of the dimensions of the recesses formed in the etching film in the plane of the substrate W.

Next, the source RF signal and bias signal supplied in step ST23 are explained. In one example, the source RF signal supplied in step ST23 can be supplied to an upper electrode in the plasma processing apparatus 1 of FIG. 2 or the antenna 14 of the plasma processing apparatus 1 in FIG. 2. The upper electrode is an example of an electrode. The source RF signal may be a continuous wave of RF or a pulsed wave. The power of the source RF signal is greater than the power of the bias signal. In one example, the power of the source RF signal may be 300 W or more. The power of the source RF signal may be 500 W or more, 1,000 W or more, or 2,000 W or more.

In one example, the bias signal supplied in step ST23 is supplied to the substrate support 11 of FIG. 2. The bias signal may be supplied to a member that can function as the bias electrode in the substrate support 11. The bias signal can be a RF signal. The power of the bias signal is less than the power of the source RF signal. In one example, the power of the bias signal may be 200 W or less. The power of the bias signal may be 100 W or less or 50 W or less. In one example, the power of the bias signal may be greater than the power of the source RF signal.

In step ST23, the substrate W is etched using a plasma formed from the processing gas. Then, the silicon-containing film SF-1 is etched using the silicon-containing film SF-2 and/or the carbon-containing film CF as a mask, so that recesses RC are formed in the silicon-containing film SF-1. The metal compound film MF is exposed at the bottom of the recesses RC. The silicon-containing film SF-2 can be etched under the same etching conditions as the silicon-containing film SF-1. These etching conditions may include the type of processing gas, power of the source RF signal, power of the bias signal, and pressure in the plasma processing chamber 10.

In step ST23, the metal-containing deposits generated in step ST21 and/or step ST22 may be removed. This metal may be a metal contained in the mask film MK. In one example, the metal may be tin (Sn). The deposits may be the residue of a compound or the like containing the metal, which was generated in the etching of step ST21 and/or step ST22. The deposits may be a deposit adhering to the substrate W, or may be a deposit adhering to the inner wall of the plasma processing chamber 10. Removing the deposits in step ST23 reduces defects in the silicon-containing film SF-1. These defects can be defects that can happen in step ST23.

Figure 4E:
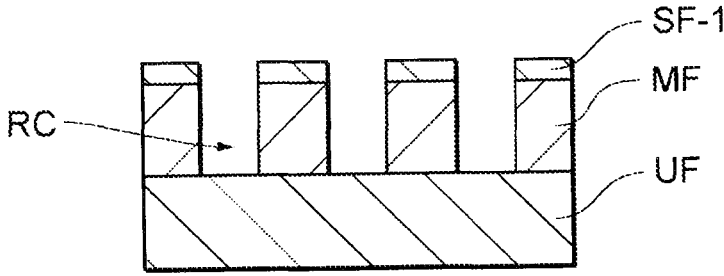
FIG. 4E illustrates an example of the cross-sectional structure of a substrate W.

Next, as illustrated in FIG. 4E, the metal compound film MF is etched in step ST24. In one example, the metal compound film MF may be etched using a plasma formed from a processing gas containing fluorine or chlorine. In step ST24, the substrate W is etched using a plasma formed from the processing gas, so that the metal compound film MF is etched using the first silicon-containing film SF-1 as a mask, thus forming recesses RC in the metal compound film MF. The underlying film UF is exposed at the bottom of each recess RC. During etching of the metal compound film MF, a portion of the silicon-containing film SF-1 may be etched.

<Examples of this Processing Method>

A substrate W having the following stack structure was prepared.

Mask film MK: tin-containing film 10 nm
Silicon-containing film SF-2: SOG 8 nm
Carbon-containing film CF: SOC 44 nm
Silicon-containing film SF-1: $SiO_2$ 15 nm
Metal compound film MF: TiN 14 nm After etching the silicon-containing film SF-2 and carbon-containing film CF in the plasma processing chamber 10, the silicon-containing film SF-1 was etched under the following Reference Example and Example conditions. The silicon-containing film SF-2 and carbon-containing film CF were etched under the same conditions in both the Reference Example and Examples.

Reference Example

Apparatus: CCP Plasma Processing Apparatus
Source RF signal: OW
Bias RF signal: 300 W
Processing gas: $CF_4$, $CHF_3$, Ar
H/F: 0.16
H/C: 0.55

Example

Apparatus: ICP plasma processing apparatus (FIG. 2)
Source RF signal: 1,500 W
Bias RF signal: 50 W
Processing gas: $C_4F_6$, $H_2$, $NF_3$, $N_2$, Ar
H/F: 0.41
H/C: 2.04

"H/F" is the ratio of the number of hydrogen atoms to the number of fluorine atoms in the processing gas. "H/C" is the ratio of the number of hydrogen atoms to the number of carbon atoms in the processing gas.

Figure 5:
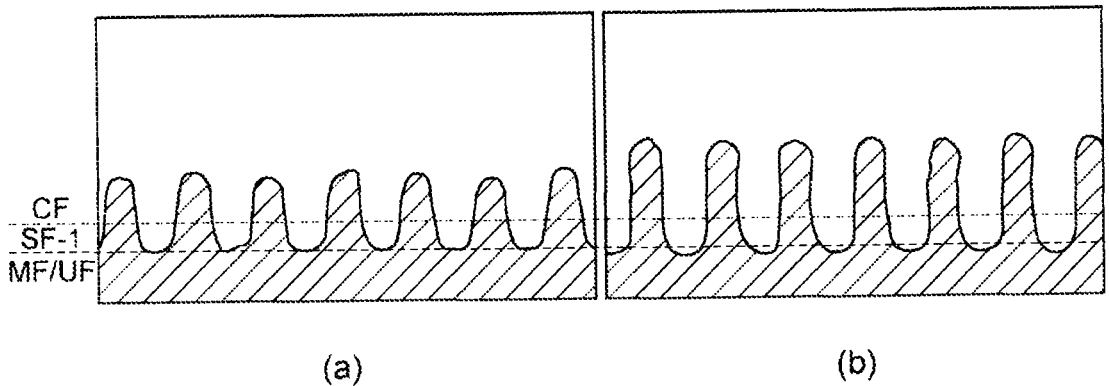
FIG. 5 schematically illustrates an example of the cross-section of the substrate W after the substrate W was etched in step ST23.

FIG. 5 schematically illustrates a part of the cross-section of the substrate W after the substrate W was etched in step ST23. In FIG. 5, (a) illustrates a cross section of the substrate W after step ST23 was performed under the conditions of Reference Example, and (b) illustrates a cross section of the substrate W after step ST23 was performed under the conditions of Example.

As illustrated in FIG. 5, Example showed better results than Reference Example. First, when etching the silicon-containing film SF-1 using the carbon-containing film CF as a mask, the selectivity ratio was greatly improved in Example. Specifically, after etching of the silicon-containing film SF-1, only 39% of the carbon-containing film CF existed in Reference Example, whereas as much as 66% of the carbon-containing film CF existed in Example. That is, the selectivity ratio was improved by about 1.7 times. In another Example in which H/F was 0.46, the thickness of the carbon-containing film CF after etching the silicon-containing film SF-1 was substantially the same as that before etching. In still another Example in which H/F was 0.54, the thickness of the carbon-containing film CF after etching the silicon-containing film SF-1 was thicker than that before etching.

Also, the cross-sectional shape of the silicon-containing film SF-1 after etching was greatly improved. Specifically, after etching the silicon-containing film SF-1, the ratio of the top CD (critical dimension) to the bottom CD (critical dimension) of the silicon-containing film SF-1 (hereinafter also referred to as "CD ratio") was 72% in Reference Example, whereas it was 91% in Example. This means that the cross-sectional shape of the silicon-containing film SF-1 after etching was gently tapered in Reference Example, whereas it was nearly vertical in Example. Moreover, in Example, the CD ratio could be controlled by controlling the etching time of the silicon-containing film SF-1. In one example, a tapered cross-sectional shape was obtained by shortening the over-etching time, and an inverse tapered cross-sectional shape was obtained by increasing the over-etching time. Also, the cross-sectional shape was made substantially vertical by controlling the over-etching time.

Figure 6:
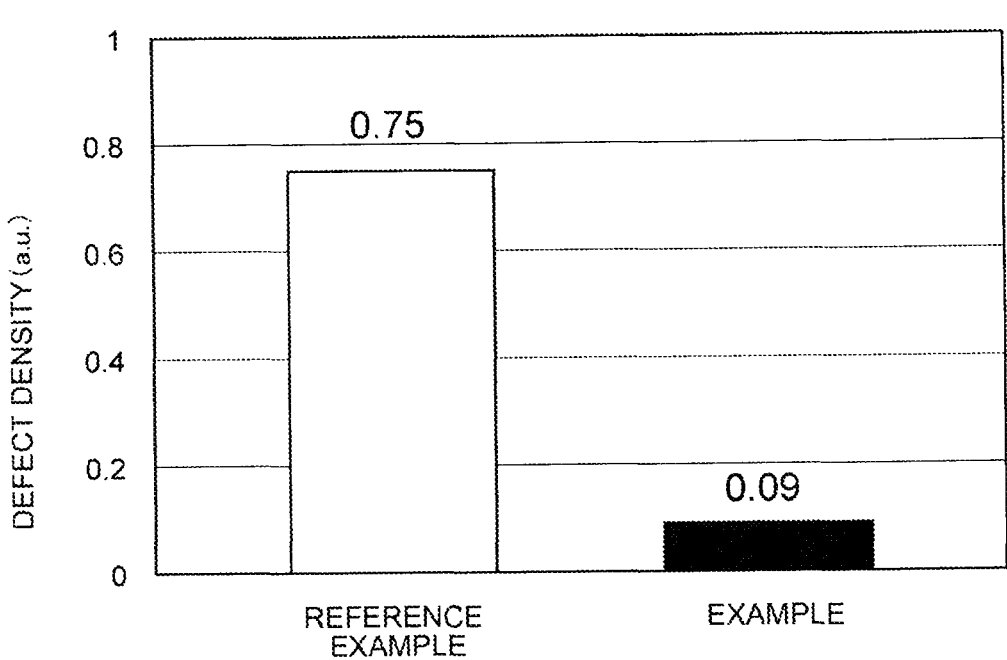
FIG. 6 is a graph indicating the defect density of the silicon-containing film SF-1.

FIG. 6 is a graph indicating the defect density of the silicon-containing film SF-1 after etching the substrate W in step ST23. In FIG. 6, the vertical axis represents the density of defects in the silicon-containing film SF-1 of the substrate W. As indicated in FIG. 6, the defect density of the silicon-containing film SF-1 in Example decreased by approximately 88% from the defect density of the silicon-containing film SF-1 in Reference Example.

Figure 7:
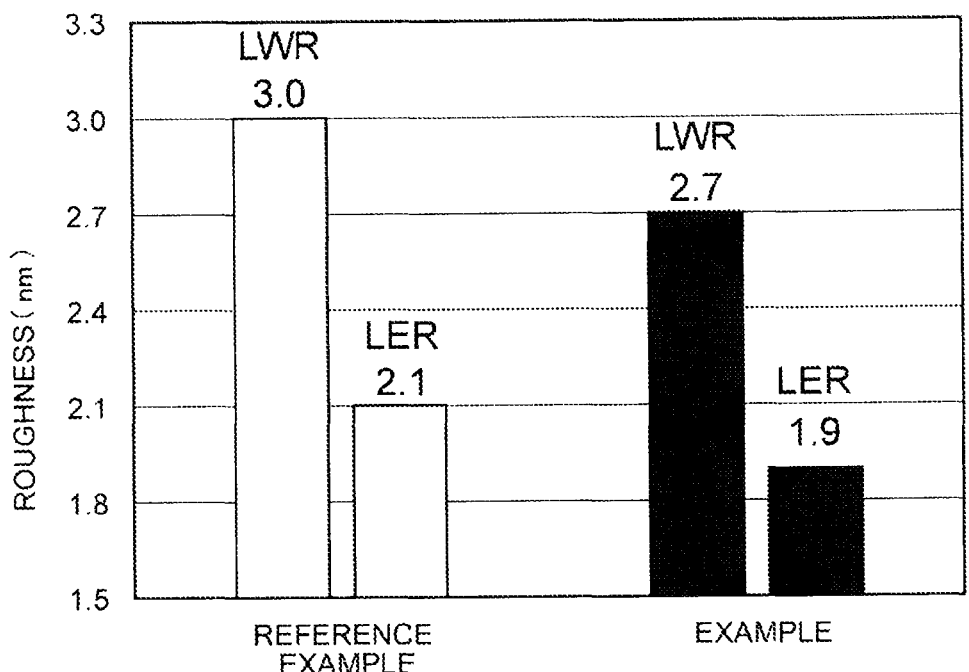
FIG. 7 is a graph indicating the LWR and LER of the silicon-containing film SF-1.

FIG. 7 is a graph indicating the line width roughness (LWR) and line edge roughness (LER) of the silicon-containing film SF-1 after etching the substrate W in step ST23. As indicated in FIG. 7, both LWR and LER were improved by about 10% in Example compared to Reference Example. In both Reference Example and Example, the opening pattern of the mask film MK was a line-and-space (L/S) pattern.

As described above, in this processing method, a metal-containing film such as a tin-containing film is used as a mask film MK in the etching of a substrate W including a silicon-containing film SF, and a processing gas with high hydrogen content is used. This enables etching of the silicon-containing film SF at a high selectivity ratio. This also achieves a silicon-containing film with a cross-sectional shape close to a perpendicular shape.

In this processing method, the silicon-containing film SF can be etched while removing deposits containing the metal contained in the mask film MK and/or defects that the mask film MK has. This reduces the influence of these deposits and/or defects in the etching of the silicon-containing film SF, thus reducing defects in the silicon-containing film SF. The deposits can be a compound containing the metal or the like that is generated in etching other films of the substrate W. The defects can be etching residue of the mask film MK that is generated in forming the opening pattern in the mask film MK.

This processing method etches the silicon-containing film SF while removing these deposits and/or defects. This therefore reduces the roughness of the pattern that the silicon-containing film SF has.

The above embodiments are just for illustration, and various modifications can be made to the embodiments without departing from the scope and spirit of this disclosure.

Exemplary embodiments of the present disclosure provide techniques of appropriately etching a substrate including a metal-containing film.

Embodiments of the present disclosure may include the following aspects.

(Addendum 1)

A plasma processing method performed with a plasma processing apparatus having a chamber,
including:
(a) preparing a substrate on a substrate support in the chamber, the substrate having an etching target film including a first silicon-containing film, and a first metal-containing film on the etching target film, the first metal-containing film including an opening pattern; and
(b) etching the etching target film,
wherein (b) including supplying a processing gas including one or more gases containing carbon, hydrogen, and fluorine into the chamber to form a plasma from the processing gas within the chamber and etch the first silicon-containing film to form the opening pattern in the first silicon-containing film, and
wherein a ratio of the number of hydrogen atoms to the number of fluorine atoms in the processing gas being 0.3 or more.

(Addendum 2)

The plasma processing method according to addendum 1, wherein the first metal-containing film includes a Sn-containing film.

(Addendum 3)

The plasma processing method according to addendum 1 or 2, wherein the first silicon-containing film includes at least one selected from the group consisting of a film containing silicon and oxygen, a film containing silicon and nitrogen, and a film stack thereof.

(Addendum 4)

The plasma processing method according to any one of addenda 1 to 3, wherein the etching target film includes an intermediate film on the first silicon-containing film,
(b) includes etching the intermediate film using the first metal-containing film as a mask, and
forming the opening pattern includes etching the first silicon-containing film using at least one of the first metal-containing film and the intermediate film as a mask.

(Addendum 5)

The plasma processing method according to addendum 4, wherein the intermediate film includes at least one selected from the group consisting of a carbon-containing film, a second silicon-containing film different from the first silicon-containing film, and a second metal-containing film different from the first metal-containing film.

(Addendum 6)

The plasma processing method according to addendum 5, wherein the intermediate film includes the carbon-containing film and a second silicon-containing film on the carbon-containing film, and the second silicon-containing film includes at least one selected from the group consisting of a film containing silicon and oxygen, a film containing silicon and nitrogen, and a film stack thereof.

(Addendum 7)

The plasma processing method according to any one of addenda 1 to 6, wherein the processing gas includes hydrogen-containing gas, carbon-containing gas, and fluorine-containing gas.

(Addendum 8)

The plasma processing method according to addendum 7, wherein the carbon-containing gas includes a gas that further includes at least one of hydrogen and fluorine.

(Addendum 9)

The plasma processing method according to addendum 7 or 8, wherein the fluorine-containing gas includes a gas that does not contain carbon.

(Addendum 10)

The plasma processing method according to any one of addenda 1 to 9, wherein a ratio of the number of hydrogen atoms to the number of carbon atoms in the processing gas is 0.3 or more.

(Addendum 11)

The plasma processing method according to addendum 4, wherein the pressure in the chamber in forming the opening pattern is lower than the pressure in the chamber in etching the intermediate film.

(Addendum 12)

The plasma processing method according to any one of addenda 1 to 10, wherein forming the opening pattern includes controlling the pressure in the chamber to 100 mTorr or less.

(Addendum 13)

The plasma processing method according to addendum 4 or 5, wherein
deposits containing a metal included in the first metal-containing film are generated in etching the intermediate film, and
forming the opening pattern includes removing the deposits adhering to the substrate.

(Addendum 14)

The plasma processing method according to addendum 4 or 5, wherein deposits containing a metal included in the first metal-containing film are generated in etching the intermediate film, and forming the opening pattern includes removing the deposits adhering to an inner wall of the chamber.

(Addendum 15)

The plasma processing method according to any one of addenda 1 to 14, wherein the plasma processing apparatus includes:

a first gas injector disposed on an upper face of the chamber so as to face the substrate support; and a second gas injector disposed on a side face of the chamber, wherein the processing gas includes one or more gases containing carbon and one or more gases without carbon, at least one of the one or more gases containing carbon is supplied from the first gas injector, and at least one of the one or more gases without carbon is supplied from the second gas injector.

(Addendum 16)

The plasma processing method according to any one of addenda 1 to 14, wherein the plasma processing apparatus includes:

a first gas injector disposed in the chamber on an upper face of the chamber; and a second gas injector disposed in the chamber on a side face of the chamber, wherein the processing gas includes at least one carbon-containing gas, the at least one carbon-containing gas is supplied into the chamber from the first gas injector and the second gas injector, and a ratio of a flow rate of the at least one carbon-containing gas supplied into the chamber from the first gas injector to a flow rate of the at least one carbon-containing gas supplied into the chamber from the second gas injector is less than 1.

(Addendum 17)

The plasma processing method according to any one of addenda 1 to 16, wherein the plasma processing apparatus includes a plasma generator above the substrate support, wherein forming the opening pattern includes:

supplying a source RF signal to the plasma generator to form a plasma from the processing gas; and supplying a bias signal to the substrate support, and wherein the power of the source RF signal has an effective value that is greater than an effective value of the power of the bias signal.

(Addendum 18)

The plasma processing method according to addendum 17, wherein the plasma generator includes an electrode facing the substrate support.

(Addendum 19)

The plasma processing method according to addendum 17, wherein the plasma generator includes an antenna disposed above the substrate support.

(Addendum 20)

The plasma processing method according to any one of addenda 17 to 19, wherein the power of the source RF signal has an effective value that is 500 W or more.

(Addendum 21)

The plasma processing method according to any one of addenda 17 to 20, wherein the bias signal is a RF signal, and the power of the bias signal has an effective value that is 200 W or less.

(Addendum 22)

The plasma processing method according to any one of addenda 1 to 21, wherein in forming the opening, the first silicon-containing film is etched using the first metal-containing film as a mask.

(Addendum 23)

The plasma processing method according to addendum 4 or 5, wherein plasma is continuously formed in the chamber from etching the intermediate film to forming the opening.

(Addendum 24)

A plasma processing system including: at least one plasma processing apparatus including a chamber, at least one gas supply, a plasma generator, and a substrate support in the chamber; and a controller, the controller being configured to perform:

(a) preparing a substrate on the substrate support, the substrate having an etching target film including a first silicon-containing film, and a first metal-containing film on the etching target film, the first metal-containing film including an opening pattern; and (b) etching the etching target film, wherein (b) including supplying a processing gas including one or more gases containing carbon, hydrogen, and fluorine into the chamber to form a plasma from the processing gas within the chamber and etch the first silicon-containing film to form the opening pattern in the first silicon-containing film, and wherein a ratio of the number of hydrogen atoms to the number of fluorine atoms in the processing gas is 0.3 or more.

What is claimed is:

1. A plasma processing method performed with a plasma processing apparatus having a chamber, comprising:

(a) preparing a substrate on a substrate support in the chamber, the substrate having an etching target film including a first silicon-containing film, and a first metal-containing film on the etching target film, the first metal-containing film including an opening pattern, wherein the first metal-containing film comprises a Sn-containing film, and wherein the Sn-containing film is a photoresist film for EUV; and (b) etching the etching target film, wherein (b) including supplying a processing gas including one or more gases containing carbon, hydrogen, and fluorine into the chamber to form a plasma from the processing gas within the chamber and etch the first silicon-containing film to form the opening pattern in the first silicon-containing film, and wherein a ratio of the number of hydrogen atoms to the number of fluorine atoms in the processing gas being 0.3 or more, and wherein the bias signal is a RF signal, and the power of the bias signal has an effective value that is 200 W or less.

2. The plasma processing method according to claim 1, wherein the first silicon-containing film includes at least one selected from the group consisting of a film containing silicon and oxygen, a film containing silicon and nitrogen, and a film stack thereof.

3. The plasma processing method according to claim 1, wherein the etching target film includes an intermediate film on the first silicon-containing film,
    (b) includes etching the intermediate film using the first metal-containing film as a mask, and
    forming the opening pattern includes etching the first silicon-containing film using at least one of the first metal-containing film and the intermediate film as a mask.

4. The plasma processing method according to claim 3, wherein plasma is continuously formed in the chamber from etching the intermediate film to forming the opening.

5. The plasma processing method according to claim 3, wherein the intermediate film includes at least one selected from the group consisting of a carbon-containing film, a second silicon-containing film different from the first silicon-containing film, and a second metal-containing film different from the first metal-containing film.

6. The plasma processing method according to claim 5, wherein the intermediate film includes the carbon-containing film and a second silicon-containing film on the carbon-containing film, and
    the second silicon-containing film includes at least one selected from the group consisting of a film containing silicon and oxygen, a film containing silicon and nitrogen, and a film stack thereof.

7. The plasma processing method according to claim 1, wherein the processing gas includes hydrogen-containing gas, carbon-containing gas, and fluorine-containing gas.

8. The plasma processing method according to claim 7, wherein the carbon-containing gas includes a gas that further includes at least one of hydrogen and fluorine.

9. The plasma processing method according to claim 7, wherein the fluorine-containing gas includes a gas that does not contain carbon.

10. The plasma processing method according to claim 1, wherein a ratio of the number of hydrogen atoms to the number of carbon atoms in the processing gas is 0.3 or more.

11. The plasma processing method according to claim 1, wherein in forming the opening, the first silicon-containing film is etched using the first metal-containing film as a mask.

12. The plasma processing method according to claim 1, wherein forming the opening pattern includes controlling the pressure in the chamber to 100 mTorr or less.

13. The plasma processing method according to claim 1, wherein the plasma processing apparatus includes:
    a first gas injector disposed on an upper face of the chamber so as to face the substrate support; and
    a second gas injector disposed on a side face of the chamber, wherein
    the processing gas includes one or more gases containing carbon and one or more gases without carbon,
    at least one of the one or more gases containing carbon is supplied from the first gas injector, and
    at least one of the one or more gases without carbon is supplied from the second gas injector.

14. The plasma processing method according to claim 1, wherein the plasma processing apparatus includes:
    a first gas injector disposed in the chamber on an upper face of the chamber; and
    a second gas injector disposed in the chamber on a side face of the chamber, wherein
    the processing gas includes at least one carbon-containing gas,
    the at least one carbon-containing gas is supplied into the chamber from the first gas injector and the second gas injector, and a ratio of a flow rate of the at least one carbon-containing gas supplied into the chamber from the first gas injector to a flow rate of the at least one carbon-containing gas supplied into the chamber from the second gas injector is less than 1.

15. The plasma processing method according to claim 1, wherein the plasma processing apparatus includes a plasma generator above the substrate support,
    wherein forming the opening pattern includes:
    supplying a source RF signal to the plasma generator to form a plasma from the processing gas; and
    supplying a bias signal to the substrate support, and
    wherein the power of the source RF signal has an effective value that is greater than an effective value of the power of the bias signal.

16. The plasma processing method according to claim 15, wherein the plasma generator includes an electrode facing the substrate support.

17. The plasma processing method according to claim 15, wherein the plasma generator includes an antenna disposed above the substrate support.

18. The plasma processing method according to claim 15, wherein the power of the source RF signal has an effective value that is 500 W or more.

19. A plasma processing method performed with a plasma processing apparatus having a chamber, comprising:
    (a) preparing a substrate on a substrate support in the chamber, the substrate having an etching target film including a first silicon-containing film and an intermediate film on the first silicon-containing film, and a first metal-containing film on the etching target film, the first metal-containing film including an opening pattern; and
    (b) etching the etching target film,
    wherein (b) includes etching the intermediate film using the first metal-containing film as a mask, and supplying a processing gas including one or more gases containing carbon, hydrogen, and fluorine into the chamber to form a plasma from the processing gas within the chamber and etch the first silicon-containing film using at least one of the first metal-containing film and the intermediate film as a mask to form the opening pattern in the first silicon-containing film,
    wherein a ratio of the number of hydrogen atoms to the number of fluorine atoms in the processing gas is 0.3 or more, and
    wherein the pressure in the chamber in forming the opening pattern is lower than the pressure in the chamber in etching the intermediate film.

20. A plasma processing method performed with a plasma processing apparatus having a chamber, comprising:
    (a) preparing a substrate on a substrate support in the chamber, the substrate having an etching target film including a first silicon-containing film and an intermediate film on the first silicon-containing film, and a first metal-containing film on the etching target film, the first metal-containing film including an opening pattern; and
    (b) etching the etching target film,
    wherein (b) includes etching the intermediate film using the first metal-containing film as a mask, and supplying a processing gas including one or more gases containing carbon, hydrogen, and fluorine into the chamber to form a plasma from the processing gas within the chamber and etch the first silicon-containing film using at least one of the first metal-containing film and the intermediate film as a mask to form the opening pattern in the first silicon-containing film, wherein a ratio of the number of hydrogen atoms to the number of fluorine atoms in the processing gas is 0.3 or more, wherein deposits containing a metal included in the first metal-containing film are generated in etching the intermediate film, and forming the opening pattern includes removing the deposits adhering to the substrate.

21. A plasma processing method performed with a plasma processing apparatus having a chamber, comprising:

(a) preparing a substrate on a substrate support in the chamber, the substrate having an etching target film including a first silicon-containing film and an intermediate film on the first silicon-containing film, and a first metal-containing film on the etching target film, the first metal-containing film including an opening pattern; and (b) etching the etching target film, wherein (b) includes etching the intermediate film using the first metal-containing film as a mask, and supplying a processing gas including one or more gases containing carbon, hydrogen, and fluorine into the chamber to form a plasma from the processing gas within the chamber and etch the first silicon-containing film using at least one of the first metal-containing film and the intermediate film as a mask to form the opening pattern in the first silicon-containing film, wherein a ratio of the number of hydrogen atoms to the number of fluorine atoms in the processing gas is 0.3 or more, wherein deposits containing a metal included in the first metal-containing film are generated in etching the intermediate film, and forming the opening pattern includes removing the deposits adhering to an inner wall of the chamber.

\* \* \* \* \*